(12) United States Patent
Shiu et al.

(10) Patent No.: US 7,799,697 B2
(45) Date of Patent: Sep. 21, 2010

(54) PATTERNING METHOD IN SEMICONDUCTOR MANUFACTURING PROCESS INCLUDING AN ARRAY OF RECTANGULAR BLOCKS AND FILLING FEATURES

(75) Inventors: Wei-Cheng Shiu, Gueishan Township, Taoyuan County (TW); Ya-Chih Wang, Yonghe (TW)

(73) Assignee: Nanya Technology Corporation, Taoyuan County (TW)

( * ) Notice: Subject to any disclaimer, the term of this patent is extended or adjusted under 35 U.S.C. 154(b) by 0 days.

(21) Appl. No.: 12/153,024

(22) Filed: May 13, 2008

(65) Prior Publication Data

US 2009/0227108 A1 Sep. 10, 2009

(30) Foreign Application Priority Data

Mar. 5, 2008 (TW) ............................... 97107703 A

(51) Int. Cl.
*H01L 21/302* (2006.01)
*H01L 21/461* (2006.01)

(52) U.S. Cl. ...................... 438/734; 438/736

(58) Field of Classification Search ................. 438/734, 438/736; 257/E21.257
See application file for complete search history.

(56) References Cited

U.S. PATENT DOCUMENTS

2007/0077743 A1* 4/2007 Rao et al. .................... 438/595
2007/0249174 A1 10/2007 Yang

OTHER PUBLICATIONS

Stanley Wolf Ph.D. In Silicon Processing for the VLSI Era, vol. 2: Process Integration, Lattice Press, 1990, pp. 238-239.*

* cited by examiner

*Primary Examiner*—William M. Brewster
(74) *Attorney, Agent, or Firm*—Rosenberg, Klein & Lee

(57) ABSTRACT

A patterning method in a semiconductor manufacturing process includes the following steps. A base is provided. A target layer and a lining layer are sequentially formed on the surface of the base. The lining layer is patterned to form a plurality of rectangular blocks. A sidewall spacer material layer is formed on the rectangular blocks and the target layer. Part of the sidewall spacer material layer is removed to form a sidewall spacer on the side wall of each of the plurality of rectangular blocks. The plurality of rectangular blocks is removed, and the sidewall spacer is used as a hard sheltering mask to etch and remove part of the target layer. The overlay accuracy is improved and the dimension of the electronic elements can be reduced so that a lot of two-dimension structures can be manufactured on the wafer substrate.

6 Claims, 10 Drawing Sheets

PATTERNING METHOD IN SEMICONDUCTOR MANUFACTURING PROCESS INCLUDING AN ARRAY OF RECTANGULAR BLOCKS AND FILLING FEATURES

CROSS REFERENCE TO RELATED SPPLICATIONS

This utility Patent Application claims the benefit of priority of the prior Patent Application No. 097107703 filed on 5 Mar. 2008 in Republic of China, the disclosure of which is incorporated herein by reference.

BACKGROUND OF THE INVENTION

1. Field of the Invention

The present invention relates to a patterning method in a semiconductor manufacturing process. In particular, this invention relates to a patterning method by forming a patterned layer, forming a sidewall spacer on sidewalls of the patterned layer so as to provide two-dimensional blocks on a base in a semiconductor manufacturing process.

2. Description of the Related Art

As the semiconductor manufacturing process has been continuously developed, the dimension of the integrated circuit element is smaller than 100 nm. Commonly, the higher the quantity of the electronic elements on a unit area of the wafer substrate is, the higher the efficiency is (the quantity is higher, the operation speed is faster, and the required power is lower). When the quantity of the electronic elements on a unit area of the wafer substrate is further increased, electronic elements with smaller dimensions are required so that the manufacturing process for enhancing the revolution needs to be developed. However, there will be a lot of bottlenecks on the manufacturing processes due to limitations for reducing the dimension of the elements.

Lithography is important for the IC production and the semiconductor manufacturing process development. Lithography can be improved by improving the optical technology to increase the resolution of the pattern transfer and reduce the critical dimension (CD). Thereby, the quantity of electronic elements on a unit area of the wafer substrate is increased.

Currently, optical lithography in semiconductor manufacturing processes has a dimension limitation. Due to the optical characteristic of the optics, the line width cannot be further reduced so that the resolution of the pattern transfer cannot be further improved. Moreover, when the dimension of the electronic elements become smaller, the overlay accuracy of the photolithography process cannot be controlled well. At the same time, the other lithography processes, such as E-beam lithography, EUV lithography etc., also has the development limitation on the throughput and the materials.

U.S. patent (US 2007/0249174), declared at 25 Oct. 2007, discloses a method for a patterned nano structure with different widths. First, a cap layer and a dummy layer are formed on a substrate. Next, patterns with different widths are pattern transferred on the dummy layer, and the left side wall and the right side wall of the dummy layer and the cap layer are etched. Then, spacers are formed on the left side wall and the right side wall of the dummy layer, and the dummy layer is removed and the spacers are reserved. By using the spacer as a sheltering mask, the etch process is performed to produce the nano structure with different widths. Although the US 2007/0249174 can produce the nano structure with different widths, it merely discloses the manufacturing method for a straight-line patterned structure.

SUMMARY OF THE INVENTION

One particular aspect of the present invention is to provide a patterning method in a semiconductor manufacturing process. In addition to increase the overlay accuracy, the patterning method can produce a lot of two-dimension structures with a smaller dimension on a wafer substrate.

The patterning method includes the following steps. A base is provided. A target layer and a lining layer are sequentially formed on the surface of the base. The lining layer is patterned to form a plurality of rectangular blocks on the target layer. A sidewall spacer is formed on the sidewall of each of the rectangular blocks, and part of the target layer is exposed. The plurality of rectangular blocks is removed. Finally, the target layer is partially removed by using the sidewall spacer as an etching mask. Thereby, a pattern is formed on the target layer.

In a second embodiment, the present invention also provides a patterning method in a semiconductor manufacturing process. The patterning method includes the following steps. A base is provided. A target layer and a lining layer are sequentially formed on the surface of the base. The lining layer is patterned and a plurality of rectangular blocks is formed on target layer. A sidewall spacer is formed on the sidewall of each of the rectangular blocks, and part of the target layer is exposed. A filling layer is formed to cover the exposed part of the target layer. The sidewall spacer is removed. Finally, the filling layer and the plurality of rectangular blocks are used as a hard mask layer to partially remove the target layer. Thereby, a pattern is formed on the target layer.

The present invention has the following characteristics:

1. The overlay error caused by the upper pattern layer and the lower pattern layer being shifted in the manufacturing process is avoided. Therefore, the overlay accuracy is enhanced. The dimension of the electronic element is reduced. A smaller electronic element can be produced. The quantity of the electronic elements manufactured on the wafer substrate increases.

2. The checkerboard (CKB) unit disposition is adopted. It is very suitable for the etching process with a high depth-to-width ratio.

3. The rework rate is reduced. The required manpower and materials are reduced. The manufacturing cost is decreased.

4. A manufacturing method for manufacturing a two-dimension island-shape patterned structure is disclosed. The manufacturing method has a self-aligned characteristic. The physical limitation problem of the photo is overcome. It can increase the quantity of the electronic elements on a unit area of the wafer substrate.

For further understanding of the invention, reference is made to the following detailed description illustrating the embodiments and examples of the invention. The description is for illustrative purpose only and is not intended to limit the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
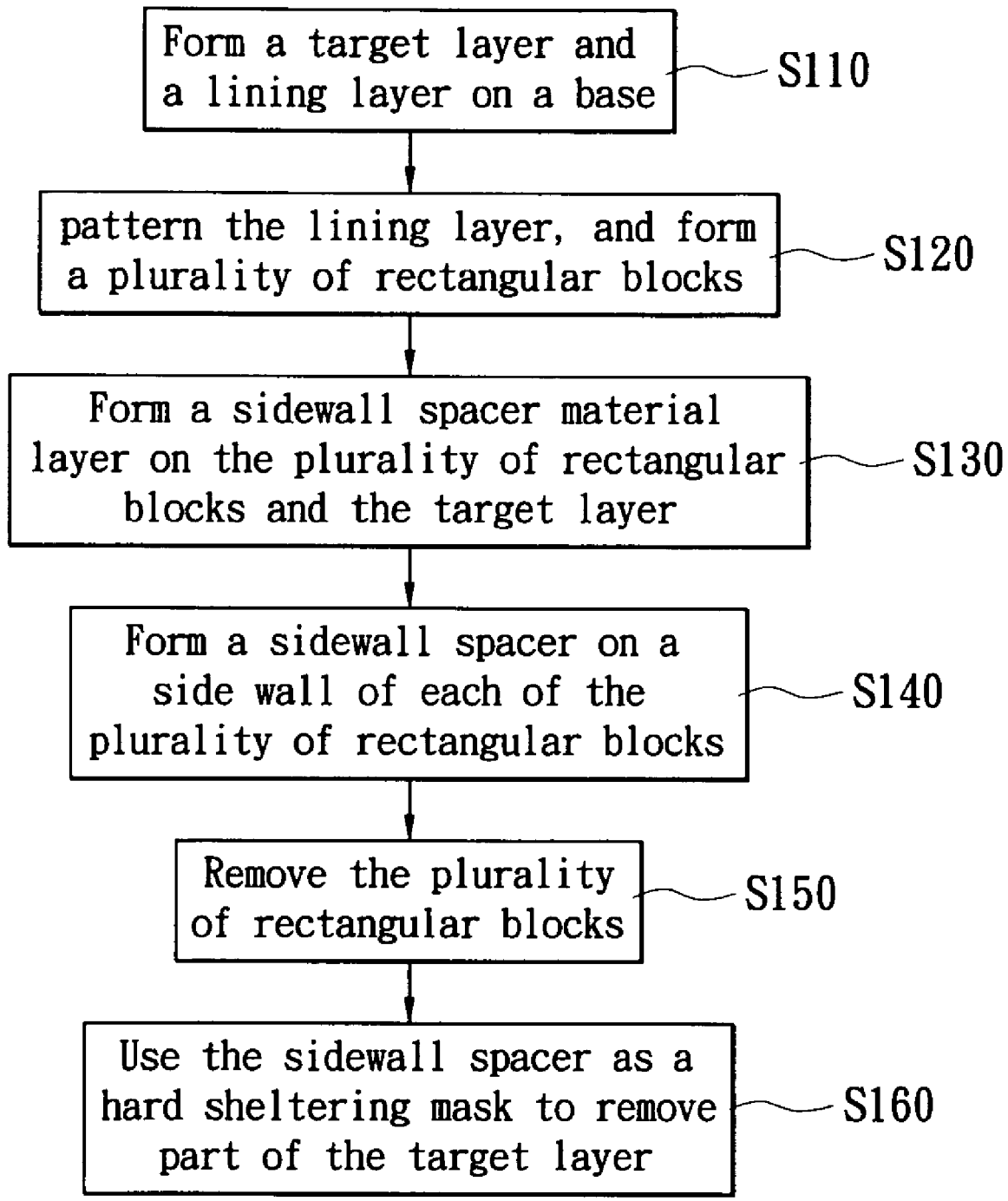
FIG. 1 is a flow chart of the patterning method in a semiconductor manufacturing process of the present invention.

Reference is made to FIG. 1. The present invention discloses a patterning method including the following steps.

S110: First, a base is provided, and a target layer and a lining layer are sequentially formed on the surface of the base.

S120: A photolithography process is performed to pattern the lining layer and partially expose the surface of the target layer. The lining layer is formed with a plurality of rectangular blocks that are disposed by a checkerboard way on target layer. The checkerboard way means that the plurality of rectangular blocks is disposed on the target layer in a staggered way.

S130: A sidewall spacer material layer is conformally formed on the rectangular blocks and the target layer blocks.

S140: The sidewall spacer material layer is partially removed to form a sidewall spacer on the sidewall of each of the plurality of rectangular blocks, and exposes part of the surface of the target layer.

S150: The plurality of rectangular blocks is removed.

S160: Finally, the sidewall spacer is used as a hard sheltering mask to selectively remove part of the target layer. Thereby, a pattern is formed on the target layer.

FIGS. 2A~8B are the schematic diagram of the patterning method in a semiconductor manufacturing process of the present invention for illustrating the present invention in detail.

Figure 2A:
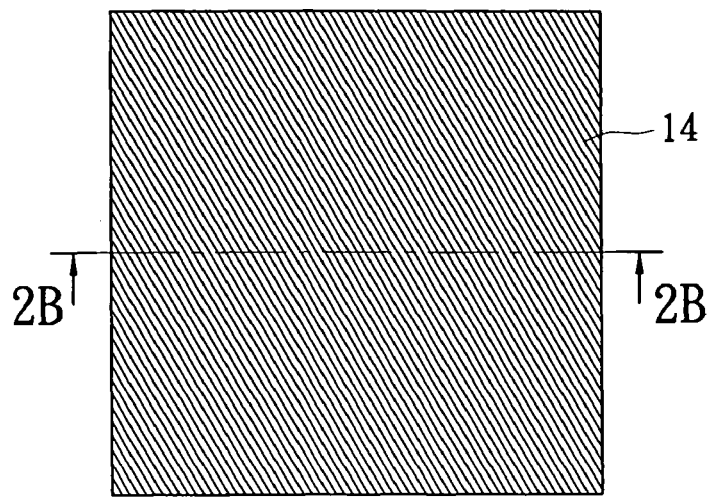
FIGS. 2A~8B are the schematic diagram of the patterning method in a semiconductor manufacturing process of the present invention.
Figure 2B:
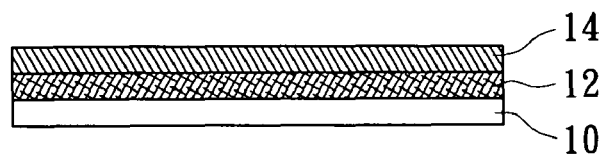

Reference is made to FIGS. 2A and 2B. First, a base 10 is provided, and a target layer 12 and a lining layer 14 are formed on the surface of the base 10. The material of base 10 is selected from the group consisting of Si, GaAs, GaN, Strained Silicon, SiGe, SiC, Diamond, Epitaxy layer or the combination thereof. The lining layer 14 is patterned by the lithography process and the etching process.

Figure 3A:
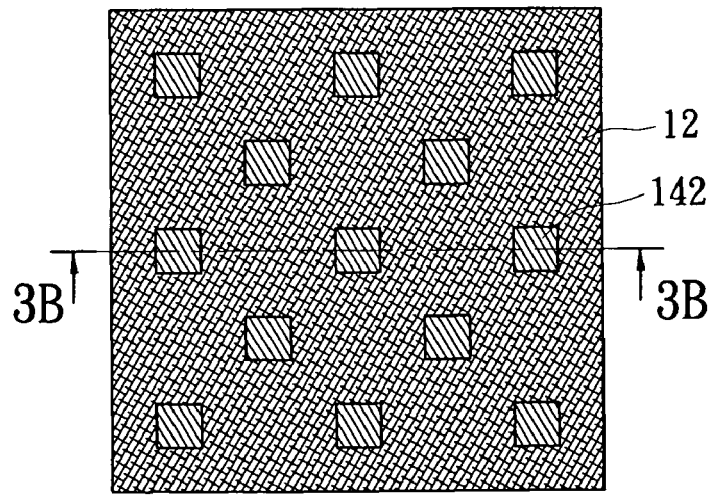
Figure 3B:
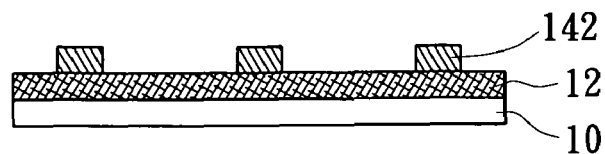

Reference is made to FIGS. 3A and 3B. The patterned lining layer 14 is formed and part of the target layer 12 is exposed. The patterned lining layer 14 is the plurality of rectangular blocks 142 that are disposed at intervals. The plurality of rectangular blocks 142 is formed on the target layer 12. The plurality of rectangular blocks 142 has a column-shape structure and are disposed at intervals in a checkerboard disposition way.

Figure 4A:
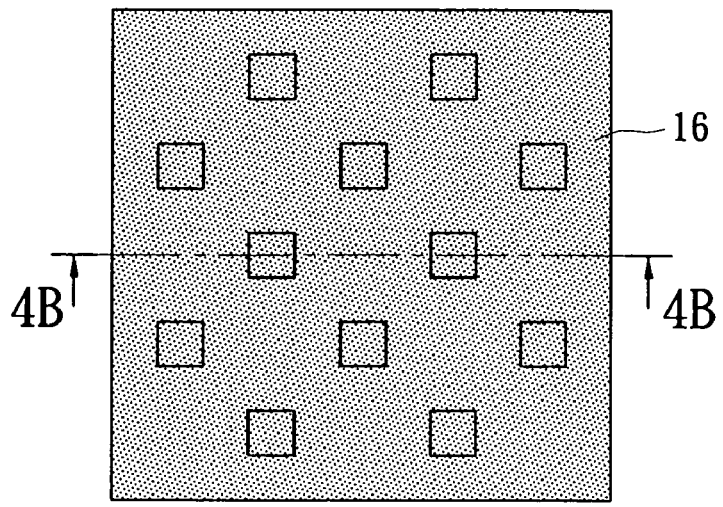
Figure 4B:
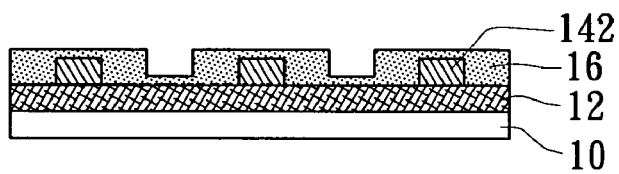

Reference is made to FIGS. 4A and 4B. A deposition process is used to form a sidewall spacer material layer 16 on the rectangular blocks 142 and the target layer 12 to cover the exposed part of the target layer 12 and the rectangular blocks 142. The sidewall spacer material layer 16 is made of nitride or any other suitable material. The sidewall spacer material layer 16 is formed by, for example, chemical vapor deposition (CVD), plasma-enhancement chemical vapor deposition (PECVD), atomic layer deposition (ALD), physical vapor deposition (PVD), spin coating, or other manufacturing processes.

Figure 5A:
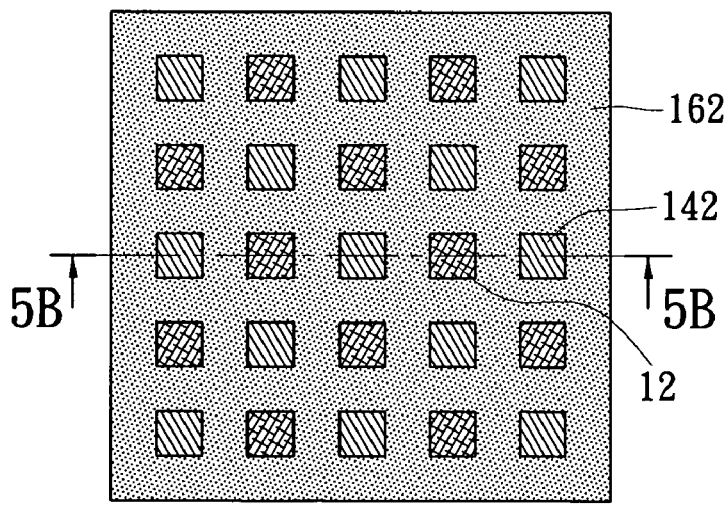
Figure 5B:
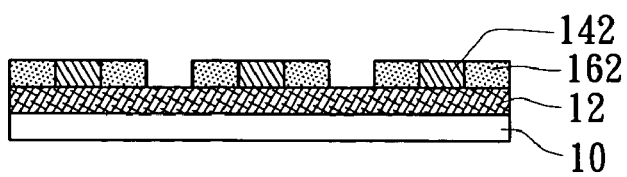

Reference is made to FIGS. 5A and 5B. An anisotropic etching process is performed to etch the sidewall spacer material layer 16 to remove part of the sidewall spacer material layer 16 and form a sidewall spacer 162 on the sidewall of each of the plurality of rectangular blocks 142, and exposes part of the target layer 12.

Figure 6A:
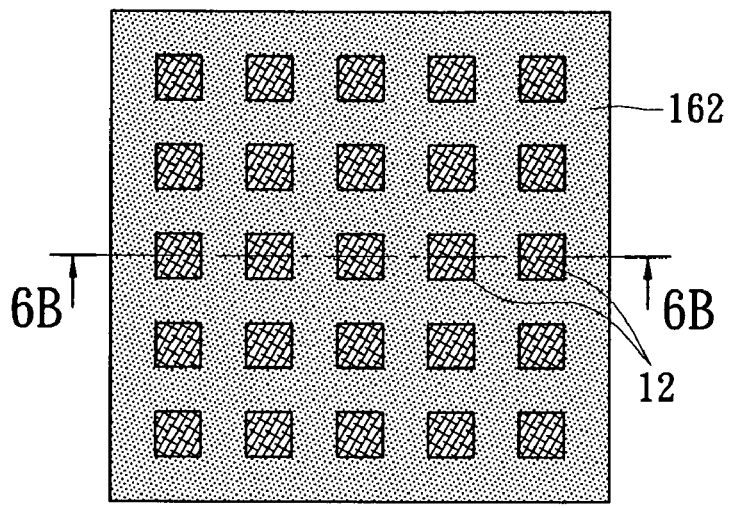
Figure 6B:
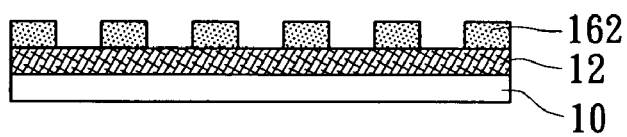
Figure 7A:
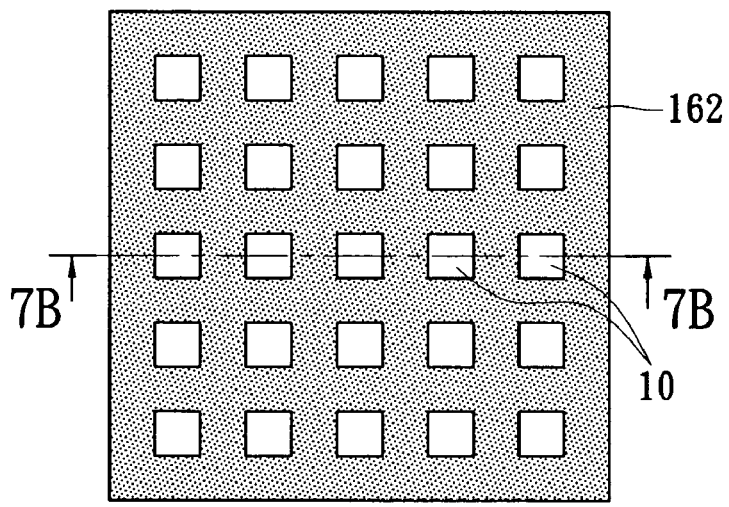
Figure 7B:
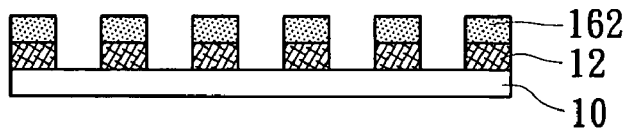
Figure 8A:
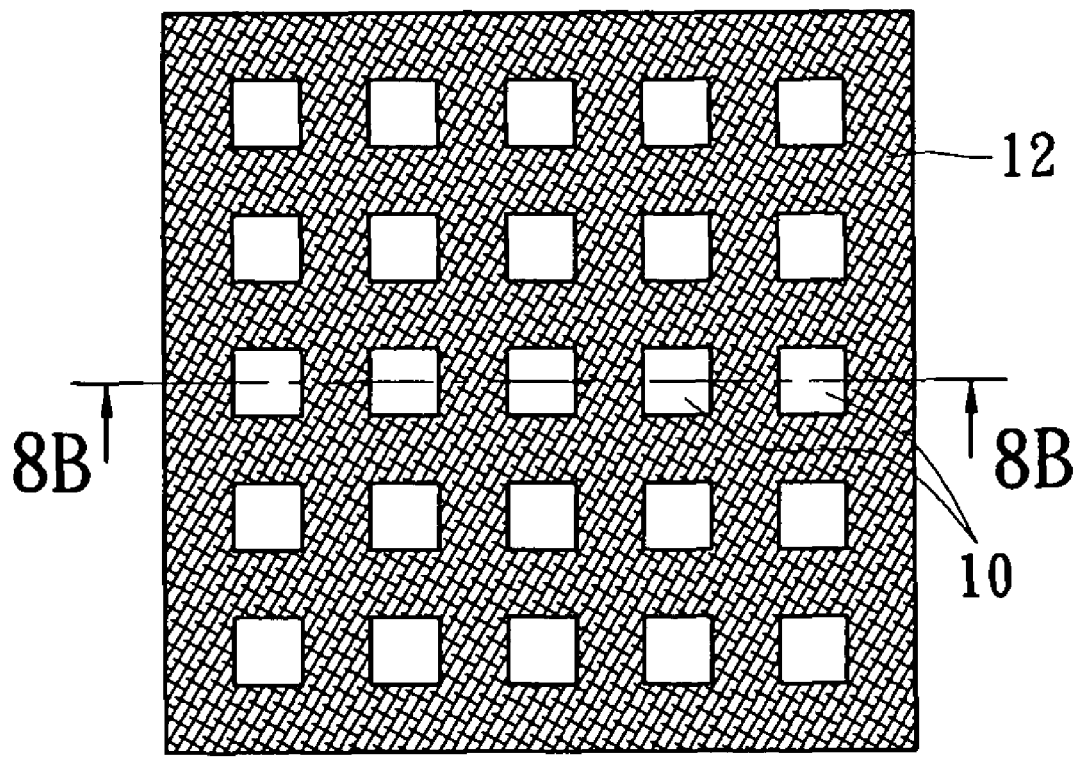
Figure 8B:
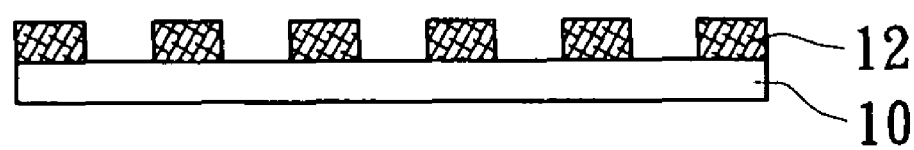

Reference is made to FIGS. 6A and 6B. A fixed etching ratio is used to selectively etch the plurality of rectangular blocks 142 to remove the plurality of rectangular blocks 142 and reserve the sidewall spacer 162. Next, the sidewall spacer 162 is used as an etching hard mask to etch the target layer 12 and partially remove the target layer 12. Finally, the sidewall spacer 162 is removed and therefore a patterned target layer 12 is formed.

Figure 9:
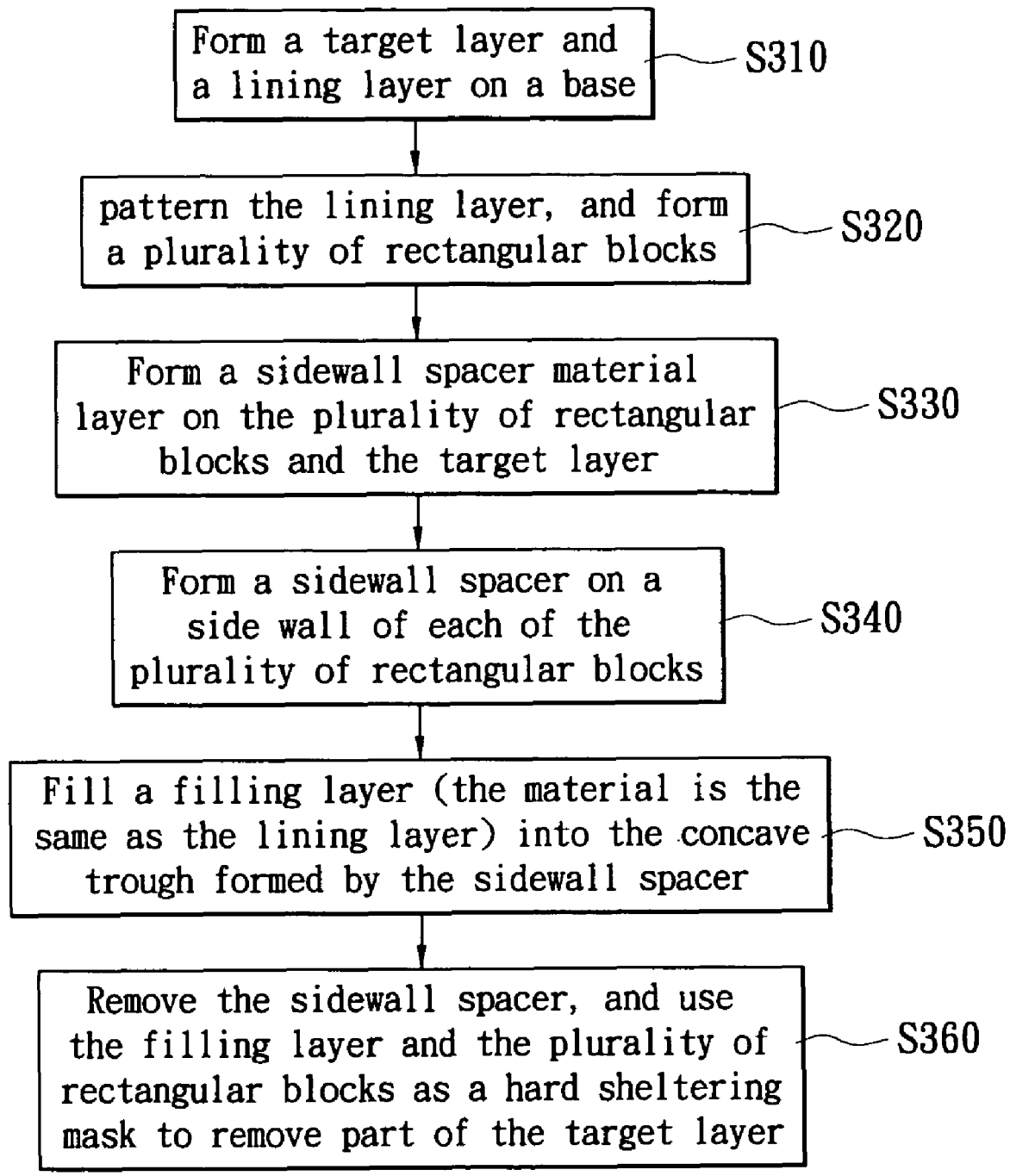
FIG. 9 is a flow chart of the patterning method in a semiconductor manufacturing process of the second embodiment of the present invention.

Reference is made to FIG. 9, which shows a second embodiment of the present invention. The patterning method includes the following steps.

S310: First, a base is provided, and a target layer and a lining layer are sequentially formed on the surface of the base.

S320: A photolithography process is performed to pattern the lining layer and partially exposes the surface of the target layer. The lining layer is formed with a plurality of rectangular blocks that are disposed by a checkerboard way on target layer. The checkerboard way means that the plurality of rectangular blocks is disposed on the target layer in a staggered way.

S330: A sidewall spacer material layer is conformally formed on the lining layer and the target layer blocks.

S340: Part of the sidewall spacer material layer is removed to form a sidewall spacer on the side wall of each of the plurality of rectangular blocks, and expose part of the surface of the target layer.

S350: A filling layer is formed on the exposed part of the target layer and between the sidewall spacer.

S360: The sidewall spacer is removed. The sidewall spacer and the plurality of rectangular blocks are used as a etching hard mask to etch and selectively remove part of the target layer. Thereby, a pattern is formed on the target layer.

FIGS. 10A~17B are the schematic diagram of the patterning method in a semiconductor manufacturing process of the second embodiment of the present invention for illustrating the present invention in detail.

Figure 10A:
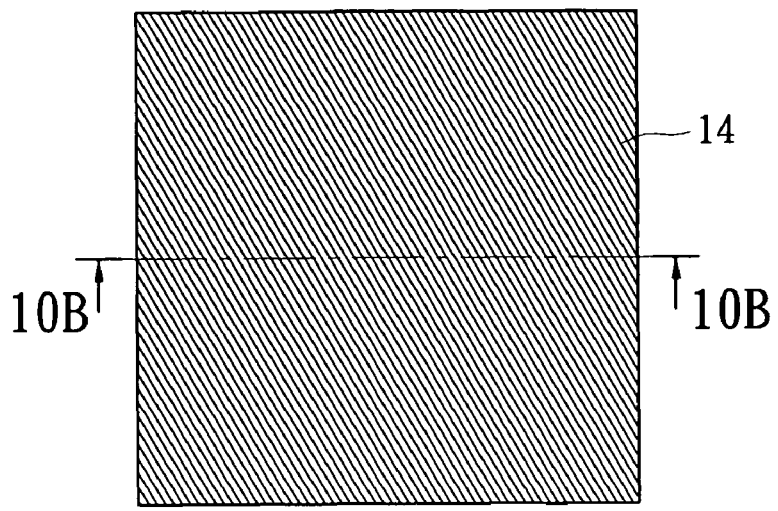
FIG. 10A~17B are the schematic diagram of the patterning method in a semiconductor manufacturing process of the second embodiment of the present invention.
Figure 10B:
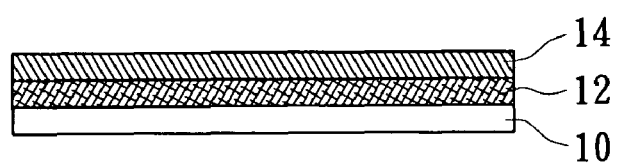

Reference is made to FIGS. 10A and 10B. First, a base 10 is provided, and a target layer 12 and a lining layer 14 are sequentially formed on the surface of the base 10. The material of base 10 is selected from the group consisting of Si, GaAs, GaN, Strained Silicon, SiGe, SiC, Diamond, Epitaxy layer or any other suitable material. The lining layer 14 is patterned by the lithography process and the etching process.

Figure 11A:
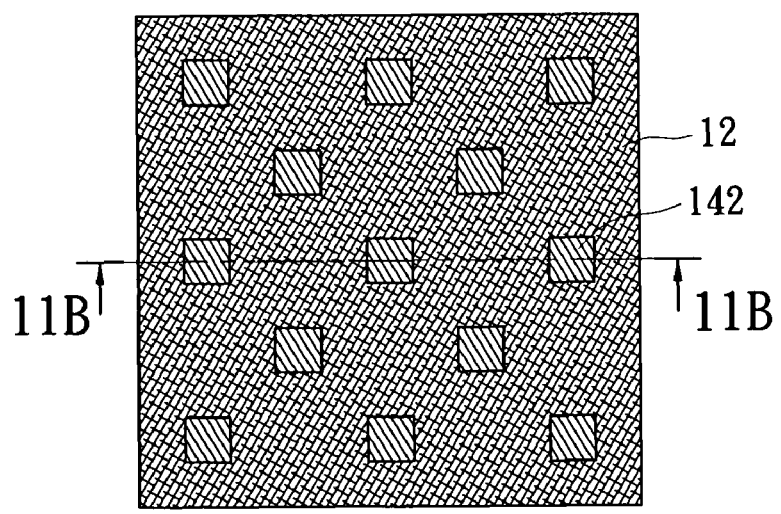
Figure 11B:
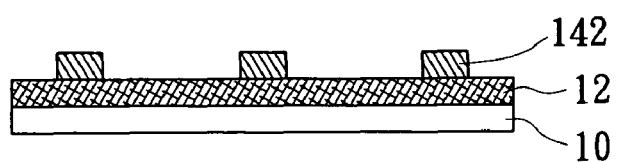

Reference is made to FIGS. 11A and 11B. The patterned lining layer 14 is formed and part of the target layer 12 is exposed. The patterned lining layer 14 is the plurality of rectangular blocks 142 that are disposed at intervals. The plurality of rectangular blocks 142 is formed on the target layer 12. The plurality of rectangular blocks 142 has a column-shape structure and are disposed at intervals in a checkerboard disposition way.

Figure 12A:
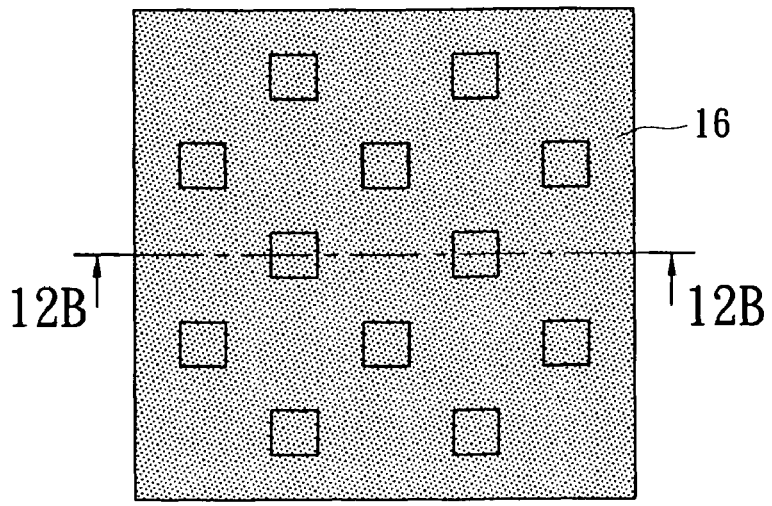
Figure 12B:
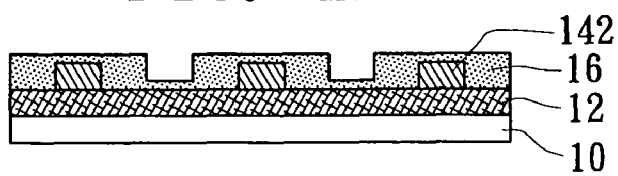

Reference is made to FIGS. 12A and 12B. A deposition process is used to form a sidewall spacer material layer 16 on the rectangular blocks 142 and the target layer 12 to cover part of the target layer 12 and the rectangular blocks 142. The sidewall spacer material layer 16 is made of a nitride layer or other suitable materials. The sidewall spacer material layer 16 is formed by the chemical vapor deposition (CVD), the plasma-enhancement chemical vapor deposition (PECVD), the atomic layer deposition (ALD), the physical vapor deposition (PVD), the spin coating, or other manufacturing processes.

Figure 13A:
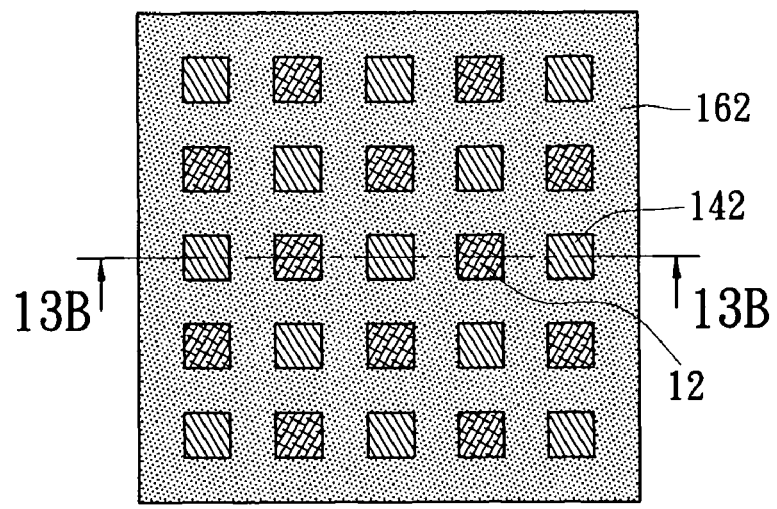
Figure 13B:
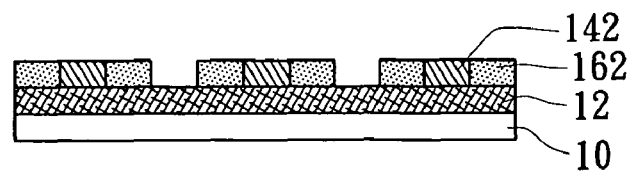

Reference is made to FIGS. 13A and 13B. An anisotropic etching process is performed to etch the sidewall spacer material layer 16 to partially remove the sidewall spacer material layer 16 and form a sidewall spacer 162 on the sidewall of each of the plurality of rectangular blocks 142, and expose part of the target layer 12.

Figure 14A:
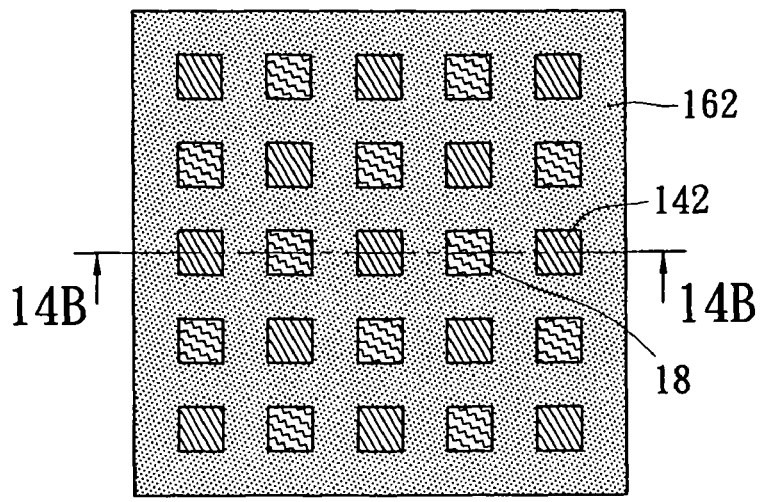
Figure 14B:
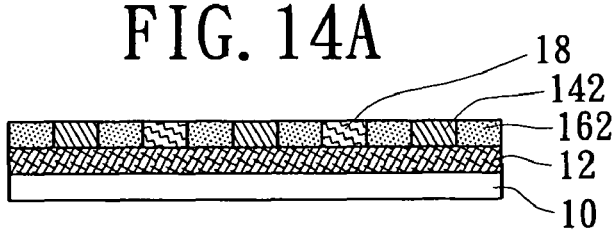

Reference is made to FIGS. 14A and 14B. A filling layer 18 is on the exposed target layer and between the sidewall spacer 162. The material of the filling layer 18 is the same as one of the plurality of rectangular blocks 142. The filling layer 18 is formed by the following steps. First, a filling material is formed on the base 10, and covers the plurality of rectangular blocks 142, the sidewall spacer 162, and the exposed target layer 12. Next, the chemical mechanical polishing (CMP) process is used to remove part of the filling material to expose the plurality of rectangular blocks 142 and the sidewall spacer 162 to form the filling layer 18.

Figure 15A:
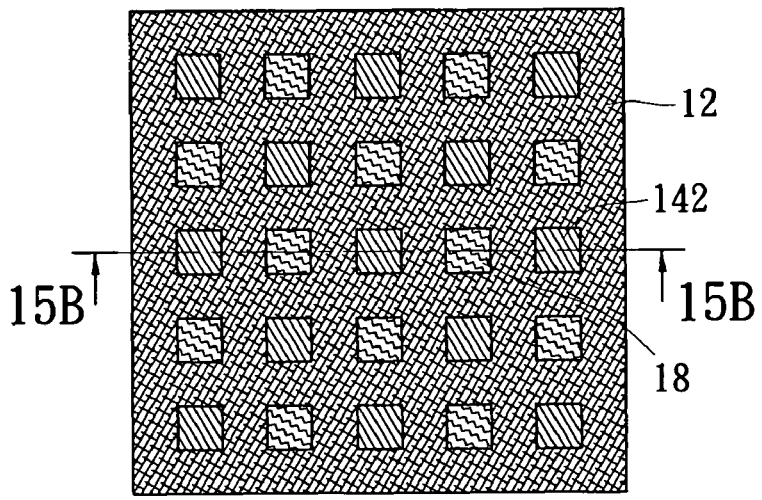
Figure 15B:
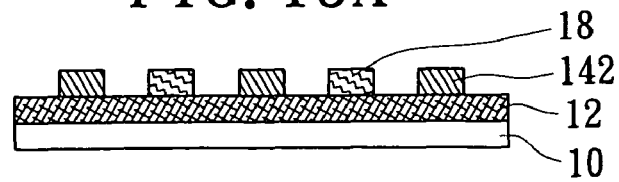

Reference is made to FIGS. 15A and 15B. A fixed etching ratio is used to selectively etch the sidewall spacer 162 to remove the sidewall spacer 162, and reserve the plurality of rectangular blocks 142 and the filling layer 18 and expose part of the surface of the target layer 12.

Figure 16A:
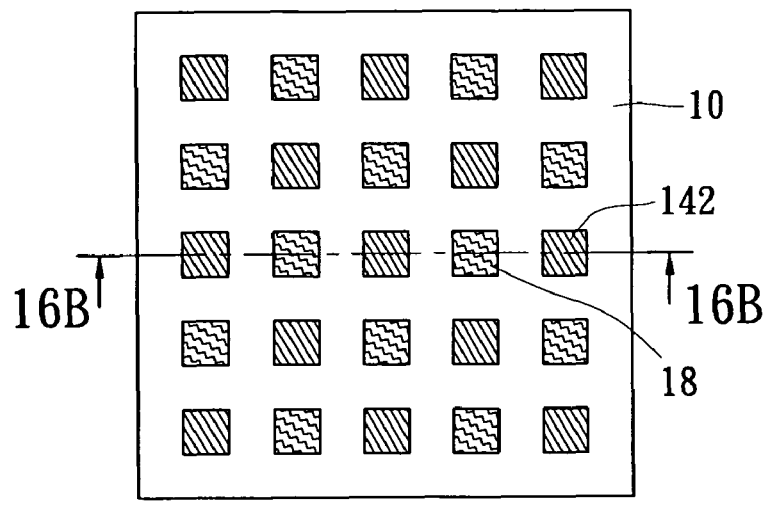
Figure 16B:
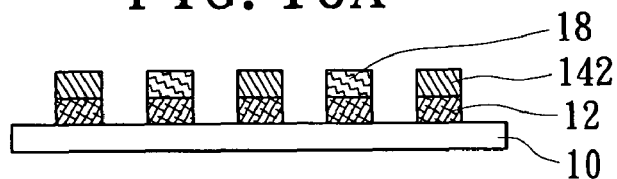
Figure 17A:
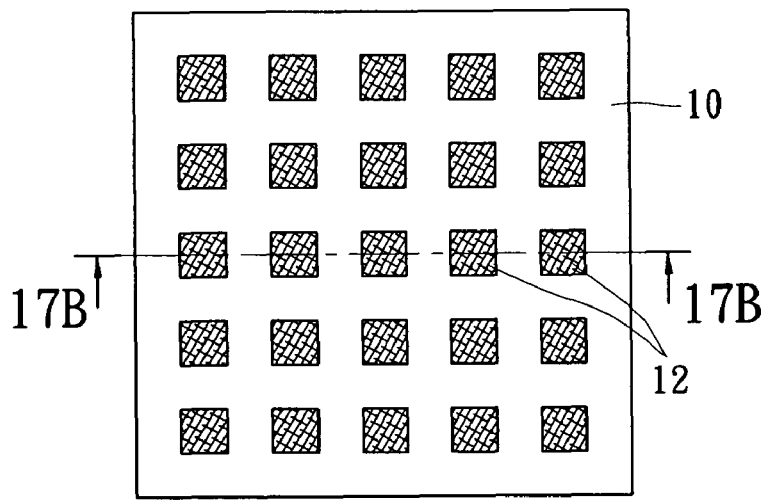
Figure 17B:
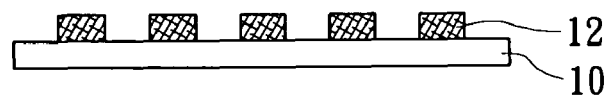

Reference is made to FIGS. 16A and 17B. The plurality of rectangular blocks 142 and the filling layer 18 are used as a etching hard mask to etch the target layer 12 to partially remove the target layer 12. Finally, the plurality of rectangular blocks 142 and the filling layer 18 are removed and therefore a patterned target layer 12 is formed.

The present invention has the following characteristics. The manufacturing method has a self-aligned characteristic and uses the sidewall spacer as an etching sheltering mask. The overlay error caused by the upper pattern layer and the lower pattern layer being shifted in the wafer manufacturing process is avoided. Therefore, the overlay accuracy is enhanced. The dimension of the electronic element is reduced. A smaller electronic element can be produced. The quantity of the electronic elements manufactured on the wafer substrate increases. The checkerboard (CKB) unit disposition is adopted. It is very suitable for the etching process with a high depth-to-width ratio. The two-dimension structure can increase the quantity of the electronic elements manufactured on the wafer substrate Furthermore, due to the overlay accuracy is improved, the rework rate is decreased. The required manpower and materials are reduced, and the manufacturing cost is decreased.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A patterning method in a semiconductor manufacturing process comprising:
   providing a base with a target layer and a lining layer sequentially formed on top of the base;
   patterning the lining layer to form a periodic array of rectangular blocks distributed on the target layer in a plurality of columns and a plurality of rows of said rectangular blocks, wherein a first pitch is defined between any two adjacent rectangular blocks in each of said plurality of columns and in each of said plurality of rows, and wherein neighboring of said plurality of columns and neighboring of said plurality of rows are spaced apart a distance smaller than said first pitch;
   forming a sidewall spacer surrounding each of the plurality of rectangular blocks in contiguous contact with sidewalls thereof, wherein the target layer is partially exposed within said sidewall spacer;
   forming a filling layer to substantially completely cover the target layer exposed within said sidewall spacer;
   removing the sidewall spacer, thereby forming a plurality of filling features disposed on said target layer between neighboring rectangular blocks in each of said plurality of rows thereof, wherein each of said plurality of filling features is separated said distance from each of said plurality of rectangular blocks adjacent thereto; and
   using the filling layer and the plurality of rectangular blocks as a hard mask to partially remove the target layer therebetween.

2. The patterning method as claimed in claim 1, wherein the sidewall spacer forming step comprises:
   forming a spacer material layer on the target layer and the plurality of rectangular blocks to cover part of the target layer and the plurality of rectangular blocks; and
   partially removing the spacer material layer to partially expose the target layer.

3. The patterning method as claimed in claim 2, wherein the spacer material layer partially removing step is an anisotropic etching 4. The patterning method as claimed in claim 3, wherein the filling layer forming step comprises:
   forming a filling material on the base to cover the plurality of rectangular blocks, the sidewall spacer and the exposed target layer; and
   partially removing the filling material to expose the plurality of rectangular blocks and the sidewall spacer.

5. The patterning method as claimed in claim 1, wherein the step of forming the filling layer comprises:
   forming a filling material on the base to cover the plurality of rectangular blocks, the sidewall spacer and the exposed target layer; and
   partially removing part of the filling material to expose the plurality of rectangular blocks and the sidewall spacer so as to form a patterned target layer having a second pitch, wherein the second pitch corresponds to said distance.

6. The patterning method as claimed in claim 5, wherein the filling material partially removing step is a chemical mechanical polishing process.

* * * * *